US008175827B2

(12) United States Patent
Walker et al.

(10) Patent No.: US 8,175,827 B2
(45) Date of Patent: May 8, 2012

(54) RF PROBE TECHNIQUE FOR DETERMINING PLASMA POTENTIAL

(75) Inventors: David N. Walker, Arlington, VA (US); Richard F. Fernsler, Annandale, VA (US); David D. Blackwell, Alexandria, VA (US); William E. Amatucci, Fairfax, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/181,556

(22) Filed: Jul. 13, 2011

(65) Prior Publication Data

US 2012/0046895 A1 Feb. 23, 2012

Related U.S. Application Data

(60) Provisional application No. 61/374,744, filed on Aug. 18, 2010.

(51) Int. Cl.
*G01R 27/00* (2006.01)
(52) U.S. Cl. ..................... 702/65; 156/345.24
(58) Field of Classification Search ............ 702/64, 702/65, 74, 75; 156/345.24; 216/59; 356/72, 356/316
See application file for complete search history.

(56) References Cited

U.S. PATENT DOCUMENTS
7,582,182 B2* 9/2009 Matsumoto et al. ..... 156/345.24

OTHER PUBLICATIONS

I. Langmuir and H. Mott Smith, "The theory of collectors in gaseous discharges", Phys. Rev. 28, 727 (1926).

R.L. Merlino, "Understanding Langmuir Probe current-voltage characteristics," Am. J. Phys. 75, 1078 (2007).
V. A. Godyak, R. B. Piejak, and B. M. Alexandrovich, "Probe diagnostics of non-Maxwellian Plasmas," J. Appl. Phys. 73, 3657 (1993).
J. J. Carroll, III, M. E. Koepke, W. E. Amatucci, T. E. Sheridan, and M. J. Alport, "A segmented disk electrode to produce and control parallel and transverse particle drifts in a cylindrical plasma," Rev. Sci. Instrum., 65(9), 2991 (1994).
R.F. Fernsler, "Modeling Langmuir probes in multi-component plasmas," Plasma Sources Sci. Technol. 18, 014012 (2009).

(Continued)

*Primary Examiner* — John H Le
(74) *Attorney, Agent, or Firm* — Amy Ressing; Joslyn Barritt (57) ABSTRACT

An rf probe is placed within a plasma and an rf signal from a network analyzer for a given dc bias voltage $V_p$ is applied The frequency applied by the network analyzer, $\omega$, is less than the plasma frequency, $\omega_{pe}$, and therefore is not in the resonant absorption range ($\omega=\omega_{pe}$) used to determine electron density in typical rf impedance probe operation. Bias voltages at the applied frequency are applied to the probe in a series of voltage steps in a range which includes the plasma potential. At each bias step, a value of $Re(Z_{ac})$, the real part of the plasma's complex impedance, is returned by the analyzer. A local minimum in the real part of the impedance $Re(Z_{ac})$ occurs where the applied bias voltage $V_p$ equals the plasma potential $\phi_p$. The plasma potential $\phi_p$ can be found by taking the first derivative of $Re(Z_{ac})$ with respect to Vp,

$$\frac{d(Re(Z_{ac}))}{dV_p},$$

and finding the value of Vp at which $$\frac{d(Re(Z_{ac}))}{dV_p} = 0$$

within error tolerances.

14 Claims, 4 Drawing Sheets

OTHER PUBLICATIONS

D.N. Walker, R.F. Fernsler, D.D. Blackwell, and W.E. Amatucci, "On the Non-intrusive Determination of Electron Density in the Sheath of a Spherical Probe," Naval Research Laboratory Memorandum Report, NRL/MR/6750-07-9033, Apr. 20, 2007.

D.N. Walker, R.F. Fernsler, D.D. Blackwell, and W.E. Amatucci, "Determining electron temperature for small spherical probes from network analyzer measurements of complex impedance," Physics of Plasmas 15, 123506 (2008).

D.N. Walker, R.F. Fernsler, D.D. Blackwell, W.E. Amatucci, and S.J. Messer, "On collisionless energy absorption in plasmas: Theory and experiment in spherical geometry," Physics of Plasmas 13, 032108 (2006).

\* cited by examiner

RF PROBE TECHNIQUE FOR DETERMINING PLASMA POTENTIAL

CROSS-REFERENCE

This application claims the benefit of priority based on U.S. Provisional Patent Application No. 61/374,744 filed on Aug. 18, 2010, the entirety of which is hereby incorporated by reference into the present application.

TECHNICAL FIELD

The present invention relates to plasma physics, specifically to a technique for determining the electric potential of a plasma.

BACKGROUND

A plasma is an ionized gas whose charged particle constituents (electrons and ions) interact primarily through electromagnetic forces. Plasmas in various forms make up a large portion of the known universe. In addition, they form the basis of a multitude of everyday devices from incandescent or fluorescent lighting to recent plasma television development. They are also used in the manufacture and processing of printed circuit boards, have recently been shown to have medical application, and are the focus of research in areas such as power generation associated with nuclear fusion reactors.

To characterize a plasma, various diagnostics must be performed to understand the physics of particle interactions. One of these parameters is plasma potential $\phi_p$. This is the potential of the plasma at a particular location usually with respect to an experimental chamber wall. This is distinguished from the floating potential at which an object immersed in the plasma collects zero net current. Floating potential is typically negative with respect to plasma potential and the two are generally not equal.

The most widely used technique still today for determining plasma parameters such as the plasma potential $\phi_p$ or the electron energy distribution function $f(\epsilon)$ is through the use of a Langmuir probe placed in the plasma. I. Langmuir and H. Mott Smith, "The theory of collectors in gaseous discharges", *Phys. Rev.* 28, 727 (1926).

One method for finding plasma potential $\phi_p$ which involves using a Langmuir probe relies on current collection using a dc voltage sweep, and from these data the dc current characteristic of the plasma $I_p(V_p)$ is derived, where $I_p$ is the probe collected current and $V_p$ is the probe voltage. R. L. Merlino, "Understanding Langmuir Probe current-voltage characteristics," *Am. J. Phys.* 75, 1078 (2007).

In Langmuir probe-based methods, plasma potential $\phi_p$ is determined by noting that the probe collected current $I_p$ with respect to probe voltage $V_p$ falls rapidly once the applied probe voltage exceeds the plasma potential $\phi_p$. Thus, $$\frac{dI_p}{dV_p}$$

has a peak, and $$\left.\frac{d^2 I_p}{dV_p^2}\right|_{V_p=\phi_p} \simeq 0.$$

See Godyak et al., "Probe diagnostics of non-Maxwellian Plasmas," *J. AppL Phys* 73, 3657 (1993). Godyak asserts that this method gives an unequivocal value for the plasma potential $\phi_p$. Id.

Thus, conventional methods of finding plasma potential $\phi_p$ using a Langmuir probe require taking a second derivative of $I_p(V_p)$ and determining the inflection point of $I_p(V_p)$, i.e., the point where $$\frac{d^2 I_p}{dV_p^2} = 0.$$

However, Langmuir probes are susceptible to contamination, and in many cases calculating the second derivative often is severely affected by noise and so introduces errors in the values of $\phi_p$.

Consequently, to avoid having to calculate the second derivative, many researchers resort to fitting routines of various forms, based in part on the probe geometry, to determine the inflection point, i.e., the point where $$\frac{d^2 I_p}{dV_p^2} = 0.$$

See, e.g., J. J. Carroll, et. al., "A segmented disk electrode to produce and control parallel and transverse particle drifts in a cylindrical plasma," *Rev. Sci. Instrum.*, 65(9), 2991 (1994). These fitting routines also have been used to avoid errors introduced by probe contamination, but by their nature are only approximate and most often assume a Maxwellian distribution. Since the fit itself treats a complete curve, a fit to one area of the curve (such as the electron saturation region) influences the entire curve fit and therefore the determination of plasma parameters. Also fitting routines should be based on physical reasoning and not on the assumption of prevailing geometry (i.e., algebraic fits) as is often the case. R. F. Fernsler, "Modeling Langmuir probes in multi-component plasmas," *Plasma Sources Sci. Technol.* 18, 014012 (2009)

Other methods which also attempt to avoid having to make this double differentiation of the current-voltage characteristic use ac voltages in an indirect determination. By superposing on V a small constant ac voltage component, $\xi \sin \omega t$, such that $\xi \ll V$, it can be shown that the time-averaged increment to the current gives the second derivative above. Yu. P. Raizer, *Gas Discharge Physics*, p. 111, (Springer-Verlag, Berlin Heidelberg New York, 1997).

However, noise remains a serious problem in all such cases. Whether calculating a second order derivative, using fitting routines or time averaging, even small amounts of noise can produce large fluctuations which generate uncertainty in the value of $\phi_p$.

The inventors herein have explored the use of an rf probe to determine parameters such as electron temperature $T_e$, electron density $n_e(r)$, and electron sheath profile structure. See D. N. Walker, R. F. Fernsler, D. D. Blackwell, and W. E. Amatucci, "On the Non-intrusive Determination of Electron Density in the Sheath of a Spherical Probe," Naval Research Laboratory Memorandum Report, NRL/MR/6750-07-9033, Apr. 20, 2007 ("Walker 2007"); D. N. Walker, R. F. Fernsler, D. D. Blackwell, and W. E. Amatucci, "Determining electron temperature for small spherical probes from network analyzer measurements of complex impedance," *Physics of Plasmas* 15, 123506 (2008) ("Walker 2008"); see also D. N. Walker, R. F. Fernsler, D. D. Blackwell, W. E. Amatucci, and S. J. Messer, "On collisionless energy absorption in plasmas: Theory and experiment in spherical geometry," *Physics of Plasmas* 13, 032108 (2006) ("Walker 2006"), all of which are hereby incorporated by reference into the present application in their entirety.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for determining plasma potential and, as a complement, the plasma electron energy distribution function by measuring and analyzing the ac impedance of an rf probe placed in a plasma.

In accordance with the present invention, a probe, e.g., a small spherical probe of radius $r_0$, is placed in a plasma. An rf signal is applied to the probe by a network analyzer connected to the probe. A portion of the rf signal is reflected by the plasma and the reflected signal is measured by the analyzer. In an exemplary embodiment, the analyzer obtains a reflection coefficient Γ from the reflected signal, and from this reflection coefficient the real and imaginary parts of the complex impedance, $\mathrm{Re}(Z_{ac})$ and $\mathrm{Im}(Z_{ac})$, can be determined for data analysis. In alternative embodiments, the analyzer itself can calculate the complex impedances independently from the reflection coefficient.

In accordance with the present invention, the plasma potential $\phi_p$ can be determined from $\mathrm{Re}(Z_{ac})$, the real part of the complex impedance returned by the network analyzer from the rf probe.

In the method of the present invention, the dc bias voltage applied to probe is varied in a series of steps, for example, from −5V to +5V in steps of 0.1 V, with the probe being kept at a fixed frequency. At each bias step, the network analyzer determines the ac impedance of the probe for the given frequency. A local minimum in the real part of the impedance $\mathrm{Re}(Z_{ac})$ occurs where the applied bias voltage $V_p$ equals the plasma potential $\phi_p$.

In accordance with aspects of the present invention, the plasma potential can be found by an appropriately programmed computer that analyzes the $\mathrm{Re}(Z_{ac})$ data returned by the network analyzer. By tracking the first derivative as a function of applied bias for a given frequency, the minimum can be found, i.e., the probe voltage at which $$\frac{d(\mathrm{Re}(Z_{ac}))}{dV_p}=0.$$

This probe voltage will be equal to the plasma potential $\phi_p$ within error tolerances.

Alternatively, plasma potential $\phi_p$ can be found graphically from a plot of the data. The values of $\mathrm{Re}(Z_{ac})$ plotted against the corresponding values of the applied bias voltage $V_p$ for a given frequency yield the plasma potential $\phi_p$ at the value of $V_p$ where the plot exhibits a minimum.

In addition, the plasma electron energy distribution function $f(\varepsilon)$ can also be determined from the complex plasma impedance by inverting $\mathrm{Re}(Z_{ac})$ to obtain $\mathrm{Re}(Z_{ac})^{-1}$ and taking its first derivative with respect to $V_p$, i.e., $$\frac{d(\mathrm{Re}(Z_{ac})^{-1})}{dV_p},$$

so that $$f(\varepsilon) \cong \frac{4}{e^3 A_p} \sqrt{\frac{m_e \varepsilon}{2}} \left( \frac{d\mathrm{Re}(Z_{ac})^{-1}}{dV_p} \right)_{V_p = \phi_p - \varepsilon/e}.$$

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that other aspects, features, and/or embodiments or structural and functional modifications may be made by one skilled in the art without departing from the scope of the present disclosure.

For example, in some embodiments, a spectrum analyzer may also be used rather than a network analyzer. Although a spectrum analyzer can be used to some extent for similar analysis as that described here, it provides no phase (or $\mathrm{Im}(Z_{ac})$) information and is itself by nature only a passive device. Therefore, in such a case, an external signal generator also must be used and ultimate analysis would rely on external circuitry to determine $\mathrm{Im}(Z_{ac})$.

The present invention provides methods for determining plasma potential by measuring the ac impedance of an rf probe in the plasma. Unlike the dc impedance, the ac impedance is insensitive to the small applied ac voltage, the presence of ions, the surface condition of the probe, secondary electron emission, and the shape of the energy distributions of the plasma constituents. The ac impedance does, however, depend on the dc bias applied to the probe, and such biases can vary from plasma potential to large negative values. This regime is commonly referred to as the ion collection regime. Since the rf signal applied is on the order of millivolts and therefore much smaller than the dc bias, the rf fields perturb the plasma far less than the dc fields. In addition, the rf measurements are far less sensitive to the effects of surface contamination and secondary electron emission than conventional dc measurements. This method has broad application for space and laboratory determination of sheath structure and can be used in both high and low neutral pressure regimes.

The present invention includes a computer-implemented method for determining plasma potential $\phi_p$ from the real part of the ac impedance returned by a network analyzer connected to a probe placed in the plasma. Determining plasma potential $\phi_p$ in accordance with the present invention can be accomplished by executing one or more sequences of instructions contained in computer-readable program code read into a memory of one or more general or special purpose computers configured to execute the instructions.

In some embodiments, the data based on the ac impedance returned by a network analyzer can be presented in graphical form from which the plasma potential $\phi_p$ can be inferred.

In the method of the present invention, the dc bias voltage applied to probe is varied in a series of steps, for example, from −5V to +5V in steps of 0.1 V, with the probe being kept at a fixed frequency. At each bias step, the network analyzer determines the ac impedance of the probe for the given frequency.

Probe biases, along with the network analyzer- applied frequencies and operation sequences can also be computer-controlled using any suitable software, for example, Labview™ software available from National Instruments Corporation. The values of the impedances obtained by the analyzer can be accessed by the computer for processing and analysis in real time or can be stored in a storage medium for later analysis using either of the two methods outlined above.

A local minimum in the real part of the impedance $\text{Re}(Z_{ac})$ occurs where the applied bias voltage $V_p$ equals the plasma potential $\phi_p$, and thus in accordance with the present invention, the plasma potential $\phi_p$ can be determined from the values of $\text{Re}(Z_{ac})$ returned by the network analyzer from the rf probe.

In addition, in certain circumstances, the present invention provides a method for determining the plasma electron energy distribution function $f(\varepsilon)$ from the complex plasma impedance, where $$f(\varepsilon) \cong \frac{4}{e^3 A_p} \sqrt{\frac{m_e \varepsilon}{2}} \left( \frac{d\text{Re}(Z_{ac})^{-1}}{dV_p} \right)_{V_p = \phi_p - \varepsilon/e}.$$

Thus, in accordance with the present invention, a probe connected to a network analyzer is inserted into a plasma and an rf signal is applied to the probe by the analyzer.

A portion of the rf signal will then be reflected by the plasma, and the network analyzer provides the complex reflection coefficient $\Gamma$ from the reflected signal. The ac plasma impedance $Z_{ac}$ can then be obtained from $\Gamma$ as a function the applied angular frequency $\omega$ of the probe, i.e., $$Z_{ac}(\omega) = Z_0 \left[ \frac{1 + \Gamma(\omega)}{1 - \Gamma(\omega)} \right]$$

where $Z_0$ is the internal impedance of the analyzer, e.g., 50Ω. See Walker 2008. The network analyzer and its connection to the probe can be calibrated to eliminate cabling impedances so to return only the real $\text{Re}(Z_{ac})$ and imaginary $\text{Im}(Z_{ac})$ parts of Z from the reflection coefficient $\Gamma$.

As described in more detail below, the present invention provides methods for determining the plasma potential from the real part $\text{Re}(Z_{ac})$ of the complex impedance returned by the network analyzer.

Figure 1:
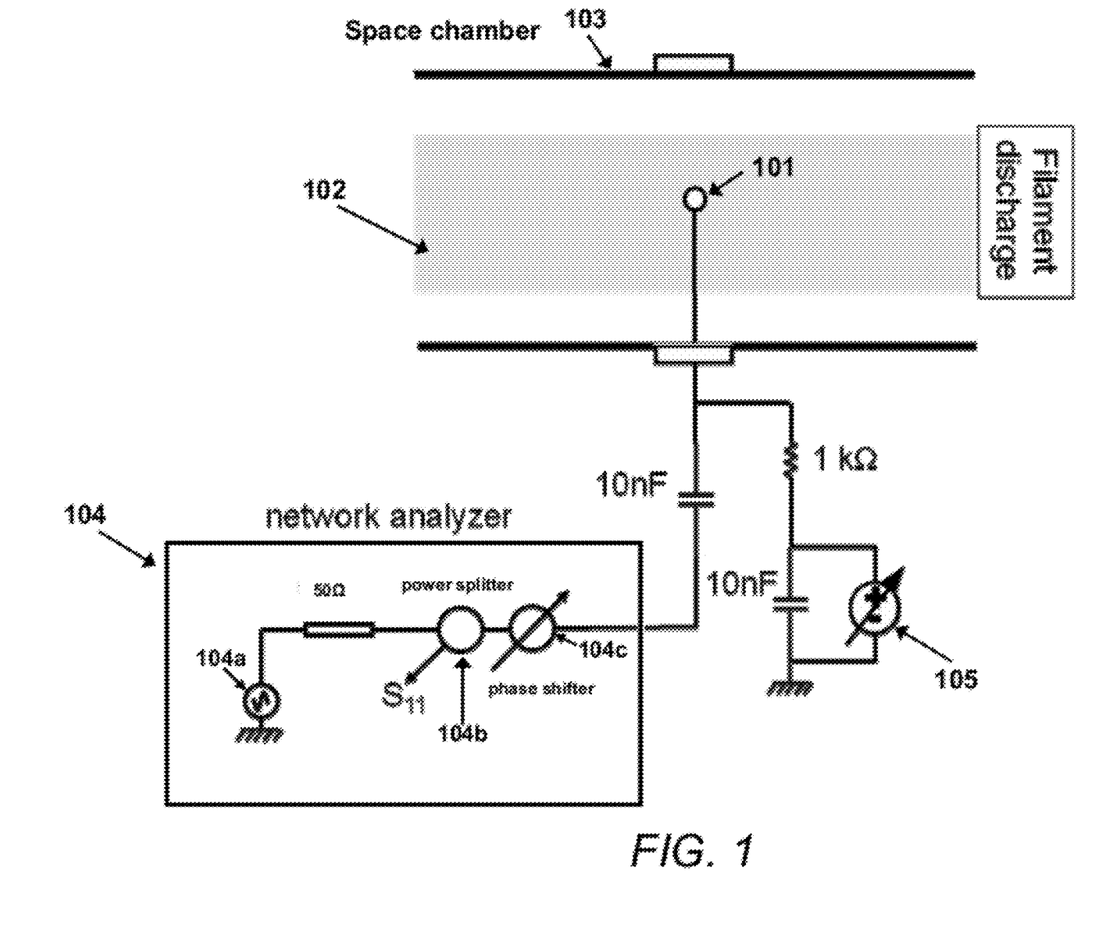
FIG. 1 shows a schematic representation of an exemplary embodiment of an impedance probe in a plasma along with network analyzer circuitry that can be used in accordance with the present invention.

FIG. 1 is a schematic diagram of an exemplary configuration of an impedance probe apparatus that can be used in a method for finding plasma potential $\phi_p$ in accordance with the present invention.

As shown in FIG. 1, an impedance probe apparatus in accordance with the present invention can include a spherical rf probe 101 having a radius $r_0$ situated within a plasma 102 housed within a large vacuum chamber 103.

In the experimental configurations used by the inventors herein, chamber 103 was 2 m in diameter and 5 m long, though chambers having other dimensions may of course also be used as appropriate. The plasma was created by a hot tungsten filament that was biased to −70V and covered a large portion of one end-plate. The plasma densities varied between $10^7$ and $10^9$ cm$^{-3}$, and the typical chamber pressure was $10^{-4}$ Torr of argon. The electron-neutral collision frequency was thus less than $10^5$ s$^{-1}$, which is much smaller than the unperturbed electron plasma frequency, $\omega_{p0} \sim 6 \times 10^8$ s$^{-1}$ ($f_{p0} \sim 100$ MHz). A low-level axial magnetic field on the order of 1-2 G was provided by five water-cooled coils aligned axially in a Helmholtz configuration (not shown), where the magnetic field affects both the sheath around the probe and the rf electric field and allows for higher densities since diffusion to the walls is reduced. Measurements of electron density $n_e$ and temperature $T_e$ were complemented by first using the spherical probe as a Langmuir probe and sweeping $V_p$ both before and after each frequency sweep. Neutrals and ions were assumed to be at room temperature.

The electron plasma frequency, $\omega_{p0}$, is related algebraically to the electron density, and so a determination of this quantity determines the bulk plasma density at the location of the probe. Resonance occurs when the applied analyzer frequency matches $\omega_{p0}$. At this frequency, the reactive (imaginary) part of the impedance $\text{Im}(Z_{ac})$ is zero and the entire impedance is comprised of only the resistive (real) part $\text{Re}(Z_{ac})$, which has a maximum value at that point.

In the exemplary configuration shown in FIG. 1, the probe 101 is connected to a network analyzer 104 containing an rf signal source 104a connected to the probe via, for example, a son coaxial cable, a power splitter 104b, and a phase shifter 104c. Probe 101 also is connected to a variable dc voltage source 105, which, in accordance with the present invention, can vary the dc bias voltage of rf probe 101 for a fixed probe frequency $\omega$ applied by rf signal source 104a. Variation of the probe's dc bias voltage allows for the controlled change of the surrounding plasma sheath, which has measurable effects on the probe impedance. At a given applied ac frequency $\omega$ of the probe, the network analyzer 104 determines the reflection coefficient $\Gamma$ and from this $\Gamma$, the real and imaginary parts of the ac impedance, $\text{Re}(Z_{ac})$ and $\text{Im}(Z_{ac})$, are determined algebraically as described above. This calculation can be done independently with a separate processor or can be performed by the analyzer's own software.

The impedance from the cabling and support is compensated by calibrating the instrument using a 50Ω resistor, an open circuit, and separately a short circuit. An open circuit corresponds to Γ=1, a short circuit to Γ=−1, and a matched load to Γ=0. As the change in the complex reflection coefficient is small in these experiments, this calibration is critical. Care must also be taken to minimize unwanted rf noise and reflections from the chamber walls or other nearby probes. The method is tested by connecting other known resistances and capacitances to the end of the probe shaft to ensure that any error is much smaller than the changes in impedance produced by the plasma.

A brief description of the plasma physics utilized in the present invention will now be presented.

As noted above, the ac impedance $Z_{ac}$ of a probe immersed in plasma invariably contains resistive (real) and reactive (imaginary) parts. At least two different mechanisms account for the resistive part of the impedance in collisionless plasmas.

The first mechanism is resonant absorption, and it occurs in unmagnetized plasmas, for example, when the applied frequency ω equals the local electron plasma frequency $\omega_{pe}(r)$ at a distance r from the probe within the plasma. Electrons within that region absorb rf energy efficiently, and they subsequently share the energy with their neighbors through collisions and wave-particle interactions.

The second mechanism, which is explored here, occurs even when $\omega < \omega_{pe}(r)$ for all r. In this case, the impedance is resistive because the rf fields modify the rate at which electrons and ions deposit energy on the probe. To analyze this mechanism, consider a negatively biased probe with $\omega < \omega_{pe}(r_0)$, where $r_0$ is the probe radius. The negative bias $V_p$ reduces the electron density near the probe but not far away, and hence $\omega_{pe}(r) > \omega_{pe}(r_0)$ for all r.

To lowest order, the unperturbed plasma behaves like an inductor, while the electron-depleted region near the probe behaves like a resistor $R_{ac}$ in parallel with a capacitor $C_{ac}$. Both $R_{ac}$ and $C_{ac}$ vary with the dc bias $V_p$. The series inductance has no effect on the real part of the ac impedance in this model, so $$\operatorname{Re}(Z_{ac}) = \frac{R_{ac}}{1 + (\omega R_{ac} C_s)^2}.$$

(See Walker, 2008, Eq. 9 where $L_{sh}=0$) Because the electron inertia is weak when $\omega < \omega_{pe}$, the total electron current closely tracks the electron characteristic $I_e(V)$, where $I_e(V_p)$ is the dc electron current at bias $V_p$ and where $V(t)=V_p+V_{ac}e^{i\omega t}$ is the total applied bias voltage. In addition, the ac voltage from the network analyzer is so small, i.e., $V_{ac} \ll V_p$, that the magnitude of the ac electron current equals $(dI_e/dV_p)V_{ac}$, to a good approximation. The same is true for the ac ion current provided that ω is less than the ion plasma frequency $\omega_{pi}$.

If ω is chosen carefully, the ac electron current can be isolated from the ac ion current over a wide range in bias voltage $V_p$. In addition, if the applied probe frequency ω is much greater than the plasma ion frequency but less than the plasma frequency at the probe surface, i.e., $\omega_{pi} \ll \omega \ll \omega_{r_0}$, the ac ion current is small and the ac resistance is given instead by $$R_{ac} \simeq \left(\frac{dI_e}{dV_p}\right)^{-1}.$$

Furthermore, if the electrons obey the Boltzmann relationship such that $n_e(\phi_1)=n_e(\phi_2)e^{e(\Delta\phi/k_B T_e)}$, where $T_e$ is the electron temperature and $n_e(\phi_1)$ and $n_e(\phi_2)$ are the electron density at plasma potentials $\phi_1$ and $\phi_2$, respectively, then $$R_{ac} \simeq \left(\frac{dI_e}{dV_p}\right)^{-1} \simeq \frac{1}{4\pi\varepsilon_0}\left(\frac{\lambda_D}{r_0}\right)^2 e^{e(\phi_p - V - )/T_e} \sqrt{\frac{2\pi m_e}{T_e}}$$

for $V_p \leq \phi_p$ where $m_e$ is the electron mass and $\lambda_D = (T_e/m_e)^{1/2}/\omega_{p0}$ is the electron Debye length for a plasma at temperature $T_e$ and unperturbed plasma frequency $\omega_{p0}$.

The dc electron current $I_e$ grows rapidly with bias voltage $V_p$ up to the plasma potential $\phi_p$, but slowly once $V_p > \phi_p$. Therefore, $R_{ac}$ is a minimum at $V_p = \phi_p$, i.e., at $$V_p = \phi_p, \frac{dR_{ac}}{dV_p} = -R^2\left(\frac{d^2 I_e}{dV_p^2}\right) = 0,$$

and thus, as noted above, the plasma potential $\phi_p$ can be found by finding the value of $V_p$ where this second derivative equals zero.

However, also as noted above, taking the second derivative will very often introduce an undesirable amount of noise into the analysis and make an accurate determination of $\phi_p$ difficult.

The present invention overcomes this problem by not requiring the calculation of the second derivative. Instead, as described below, in accordance with the present invention, the plasma potential $\phi_p$ relative to system ground can be determined by taking the first derivative of the real part of the plasma impedance with respect to the probe voltage $V_p$ and finding the value of $V_p$ where the first derivative equals zero.

As noted above, $$\operatorname{Re}(Z_{ac}) = \frac{R_{ac}}{1 + (\omega R_{ac} C_s)^2}.$$

However, if the probe is configured so that its radius is much larger than the Debye length $\lambda_D$ of the plasma, e.g., $r_0 \geq 10\lambda_D$, and the applied probe frequency ω is set so that it is much less than the unperturbed plasma frequency $\omega_{p_0}$, e.g., $\omega < 0.1\omega_{p_0}$, then $\omega R_{ac} C_{ac} \ll 1$. In such a case, $\operatorname{Re}(Z_{ac}) \simeq R_{ac}$ and like $R_{ac}$, $\operatorname{Re}(Z_{ac})$ also is at a minimum at $\phi_p$. Consequently $$\frac{dR_{ac}}{dV_p} = \left(\frac{d\operatorname{Re}(Z_{ac})}{dV_p}\right),$$

and at $$V_p = \phi_p, \frac{d\operatorname{Re}(Z_{ac})}{dV_p} = 0.$$

Thus, in accordance with the present invention, the potential $\phi_p$ of a plasma can be determined by placing a probe into the plasma, where the probe has a radius much larger than that of the Debye length $\lambda_D$ of the plasma and an applied ac frequency ω much smaller than the plasma ion frequency, varying the dc bias voltage on the probe $V_p$ in a series of voltage steps, receiving data of the real part of the plasma impedance, i.e., Re($Z_{ac}$), from a network analyzer operatively connected to the probe at each voltage step, determining a relationship between Re($Z_{ac}$) and $V_p$, taking the first derivative of Re($Z_{ac}$) with respect to the probe voltage $V_p$, i.e., finding $$\frac{d\text{Re}(Z_{ac})}{dV_p},$$

and calculating the value of $V_p$ where $$\frac{d\text{Re}(Z_{ac})}{dV_p} = 0.$$

In an exemplary embodiment, the probe can have a radius $r_0 \geq 10\lambda_D$ and an applied ac frequency $\omega < 0.10\omega_{pi}$, but other dimensions and frequencies can also be used as appropriate.

Moreover, for practical implementation in many cases only a plot of Re($Z_{ac}$) versus $V_p$ is necessary to locate the minimum. In cases where an exact value of the plasma potential is not necessary, a close estimate of the plasma potential $\phi_p$ can be made by a simple visual inspection of a plot of the returned Re($Z_{ac}$) at each value of the probe voltage $V_p$, where the plasma potential $\phi_p$ is equal to the value of $V_p$ where the plot exhibits a local minimum. This can be seen in the plot shown in FIG. 2 and the plots shown in FIG. 3. These Figures contain plots of Re($Z_{ac}$) as a function of applied probe voltage $V_p$ for a series of applied rf frequencies, each of which attains a minimum at an applied bias voltage value of approximately 1.6 Volts.

Thus, in accordance with another embodiment of a method for finding plasma potential $\phi_p$ in accordance with the present invention, an estimate of the plasma potential $\phi_p$ can be obtained by placing a probe into the plasma, where the plasma has a radius $r_0$ much larger than the Debye length $\lambda_D$ of the plasma and an applied ac frequency $\omega$ much smaller than the plasma ion frequency, varying the probe voltage $V_p$ in a series of voltage steps, receiving data of the real part of the plasma impedance, i.e., Re($Z_{ac}$), from a network analyzer operatively connected to the probe at each voltage step, and plotting the value of Re($Z_{ac}$) for each value of $V_p$ on a visual display, the value of plasma potential $\phi_p$ being approximately equal to the value of $V_p$ where the plot exhibits a local minimum. As with the previously described method, in an exemplary case, the probe can have a radius $r_0 \geq 10\lambda_D$ and an applied ac frequency $\omega < 0.1\omega_{pi}$, but other probe dimensions and frequencies can be used as appropriate within the scope of the method described herein.

Experimental Results

The ability of the method of the present invention to determine plasma potential $\phi_p$ is confirmed by a comparison of the values of $\phi_p$ thus obtained with the values of $\phi_p$ obtained using conventional Langmuir probe analysis.

Figure 2:
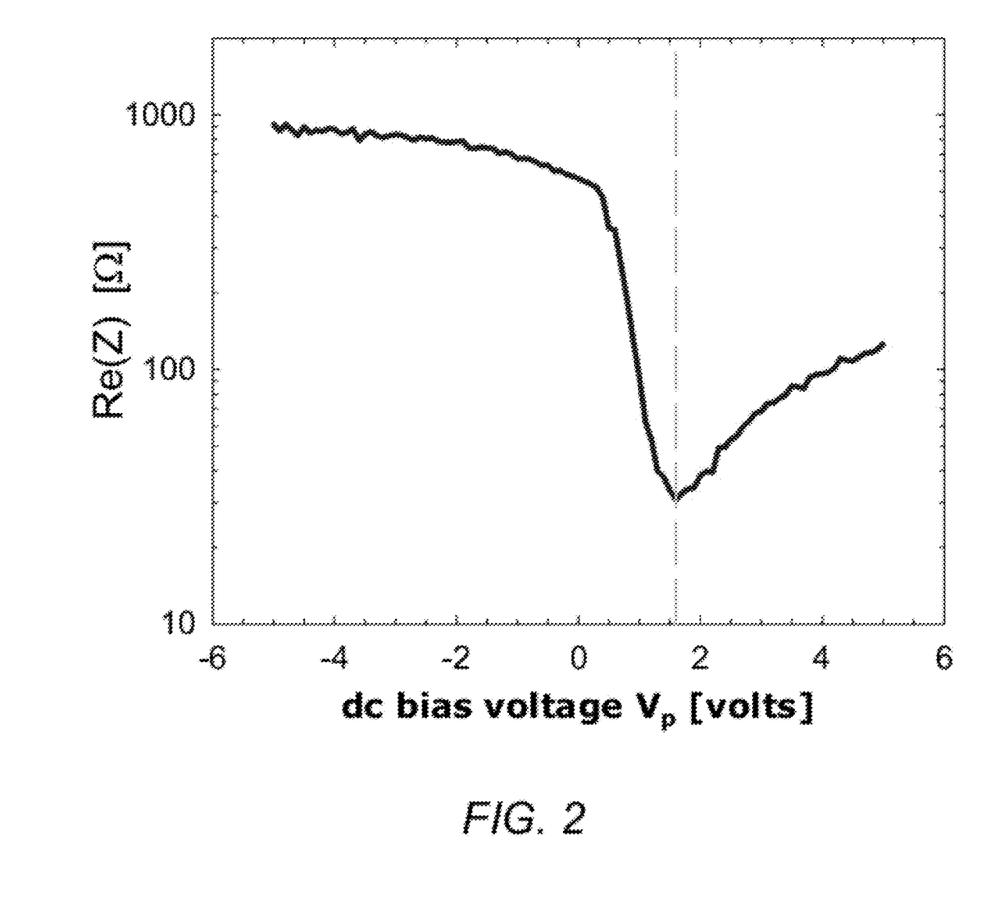
FIG. 2 depicts a plot of the real part $\mathrm{Re}(Z_{ac})$ of the impedance versus applied bias voltage $V_p$ for a single fixed frequency and illustrates that the plot exhibits a local minimum at a specific value of $V_p$ which is the plasma potential
Figure 3:
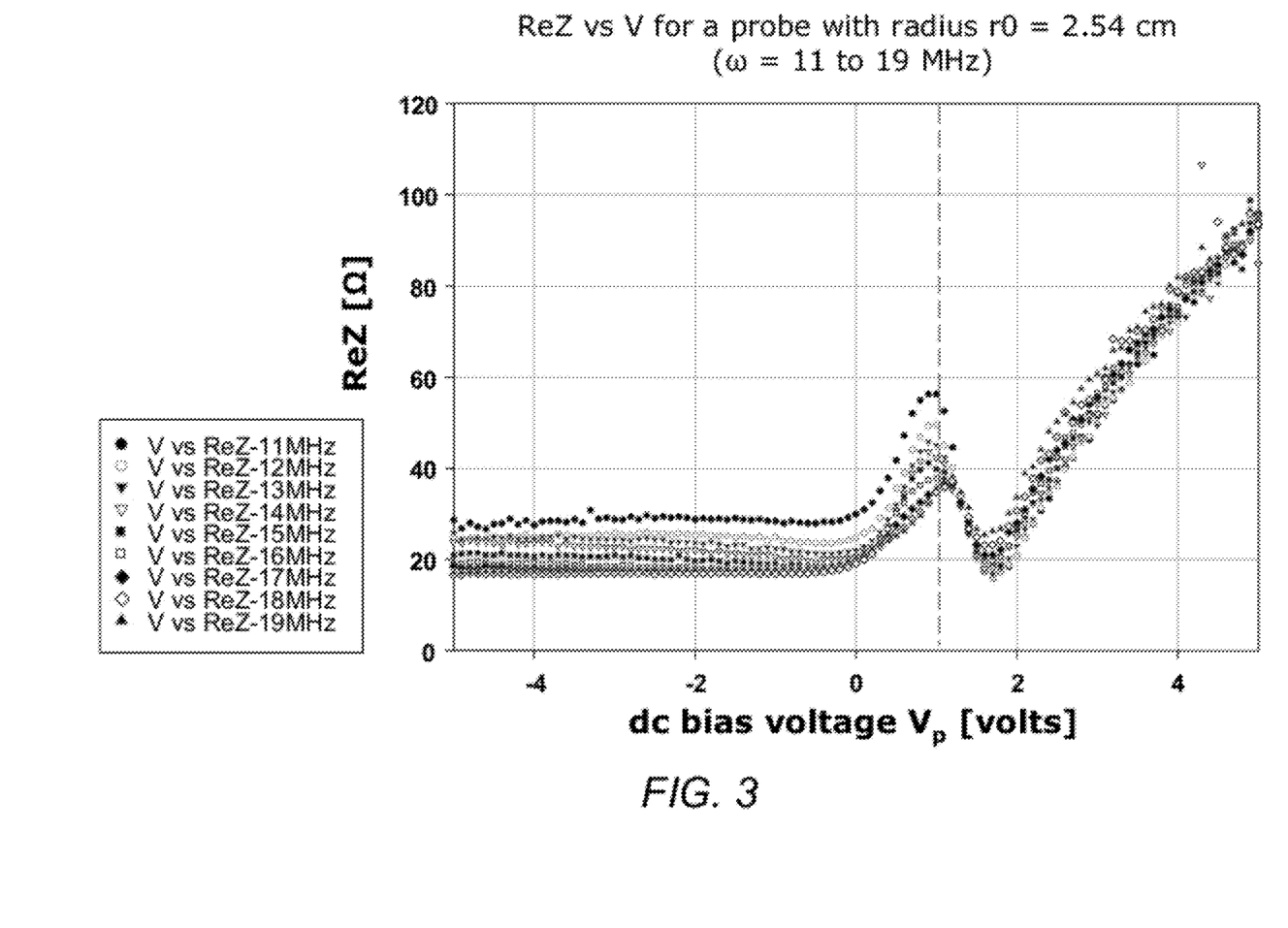
FIG. 3 depicts a set of plots showing $\mathrm{Re}(Z_{ac})$ versus applied bias voltage $V_p$ for network analyzer-applied rf probe frequencies ranging from 11 to 19 MHz and illustrates the consistency in determination of $\phi_p$ for a range of probe frequencies.

FIGS. 2 and 3 illustrate the way in which plasma potential $\phi_p$ can be determined from the returned plasma impedance Re($Z_{ac}$) in accordance with the present invention.

FIG. 2 is a plot of Re($Z_{ac}$) versus applied probe dc bias voltage for one particular probe frequency $\omega$. As can readily be seen, Re($Z_{ac}$) varies with the applied dc bias voltage as the voltage varies from −6 to +6 volts, and reaches a minimum at a single point. As described above, in accordance with the present invention, the value of the plasma potential $\phi_p$ can be calculated by an appropriately programmed computer based on data of the impedance returned by the network analyzer and the applied bias voltages, where the computer finds $\phi_p$ by solving the expression and finding the value of $V_p$ at which $$\frac{d\text{Re}(Z_{ac})}{dV_p} = 0.$$

In the case of the impedance returned from the 2.54 cm radius spherical probe illustrated in FIG. 3, $V_p = \phi_p = 1.6$V. Alternatively, the value of $\phi_p$ can be ascertained by a simple visual inspection of the plot and determining the value at which the plot reaches a minimum. As described above, plasma potential $\phi_p$ is equal to the applied voltage at which the plot exhibits a minimum, and so it can be estimated by a simple visual inspection that $\omega_p = V_p = 1.6$ V.

FIG. 3 further illustrates the way in which plasma potential $\phi_p$ can be determined from the returned plasma impedance Re($Z_{ac}$) in accordance with the present invention. FIG. 3 shows plots of Re($Z_{ac}$) versus applied probe voltage $V_p$ for a 2.54 cm spherical probe for frequency scans ranging from 11 to 20 MHz where for each scan $V_p$ is varied from −5 V to +5 V.

As with the case of a single probe frequency scan shown in FIG. 2, in accordance with the present invention, the value of the plasma potential $\phi_p$ can be calculated by an appropriately programmed computer based on data of the impedance returned by the network analyzer and the applied bias voltages, where the computer finds $\phi_p$ by solving the expression and finding the value of $V_p$ at which $$\frac{d\text{Re}(Z_{ac})}{dV_p} = 0.$$

As with the plot shown in FIG. 2, in the case of the impedance returned from a 2.54 cm spherical probe illustrated in FIG. 3, $V_p = \phi_p = 1.6$V.

In addition, as can readily be seen from the plots in FIG. 3, irrespective of the applied ac frequency $\omega$, Re($Z_{ac}$) exhibits a minimum at approximately the same value of $V_p$, and thus in accordance with the present invention, an estimate of plasma potential $\phi_p$ can be obtained by plotting the values of Re($Z_{ac}$) returned by the network analyzer against the applied probe voltages $V_p$, the value of plasma potential $\phi_p$ being approximately equal to the value of $V_p$ where the plot exhibits a local minimum, in this case where $V_p = \phi_p \approx 1.6$V.

The value of $\phi_p$ obtained using conventional Langmuir analysis is approximately 1.5V, and thus it can be seen that the value of $\phi_p$ obtained in accordance with the present invention is consistent with the values obtained using a Langmuir probe. In this case $\phi_p$ determined by the Langmuir probe was obtained by an algebraic fitting procedure. Since the probe was not subject to contamination and the distribution is largely Maxwellian the values are close. As described above, this process will not provide reliable results in general so that a second derivative must be considered along with the noise issues cited earlier. In addition, the method of the present invention is computationally simpler and more efficient since it requires only the measurement of the plasma impedance returned by the probe and a computation of a first derivative of that impedance with respect to applied voltage.

Thus, in accordance with the present invention, the plasma potential $\phi_p$ can be determined from rf measurements swept over dc biases. In this application of the rf probe method in accordance with the present invention, only a first derivative of the impedance with respect to voltage is required, and not a second, so noise effects are less and a more accurate value of plasma potential can be found.

The electron energy distribution function $f(\epsilon)$ of the plasma can be found by a computer inverting the ac resistance $R_{ac}$ to obtain $R_{ac}^{-1}$ and taking the first derivative of $R_{ac}^{-1}$ with respect to probe voltage $$V_p, \frac{dR_{ac}^{-1}}{dV_p},$$

to obtain the electron energy distribution function $$f(\epsilon) = \frac{4}{e^3 A_p} \sqrt{\frac{m_e \epsilon}{2}} \left( \frac{dR_{ac}^{-1}}{dV_p} \right)_{V_p = \phi_p - \epsilon/e},$$

where $A_p$ is the probe area, $\epsilon$ is the electron energy, $V_p$ is the applied probe voltage, and $\phi_p$ is the plasma potential found, for example, as described above.

However, in certain circumstances, the electron energy distribution function $f(\epsilon)$ can also be obtained from the plasma impedance returned from the rf probe. As noted above, if the probe is configured so that its radius is much larger than the Debye length $\lambda_D$ of the plasma, e.g., $r_0 \geq 10\lambda_D$, and preferably on the order of $r_0 \geq 50\lambda_D$, and the applied probe frequency $\omega$ is set so that it is much less than the unperturbed plasma frequency $\omega_{p_0}$, e.g., $\omega < 0.1\omega_{p_0}$, then $\text{Re}(Z_{ac}) \cong R_{ac}$ and so $R_{ac}^{-1} \cong \text{Re}(Z_{ac})^{-1}$. Thus, the energy distribution function $f(\epsilon)$ can be found by the computer inverting $\text{Re}(Z_{ac})$ to obtain $\text{Re}(Z_{ac})^{-1}$ and taking its first derivative with respect to $V_p$, i.e., $$\frac{d(\text{Re}(Z_{ac})^{-1})}{dV_p},$$

so that $$f(\epsilon) \cong \frac{4}{e^3 A_p} \sqrt{\frac{m_e \epsilon}{2}} \left( \frac{d\text{Re}(Z_{ac})^{-1}}{dV_p} \right)_{V_p = \phi_p - \epsilon/e}.$$

Thus, the plasma electron energy distribution function $f(\epsilon)$ can also be found from the plasma impedance returned by the probe. It should be noted that $f(\epsilon)$ found in this manner is valid only for plasma energies $\epsilon \leq 5T_e$, where $T_e$ is the plasma electron temperature.

Figure 4:
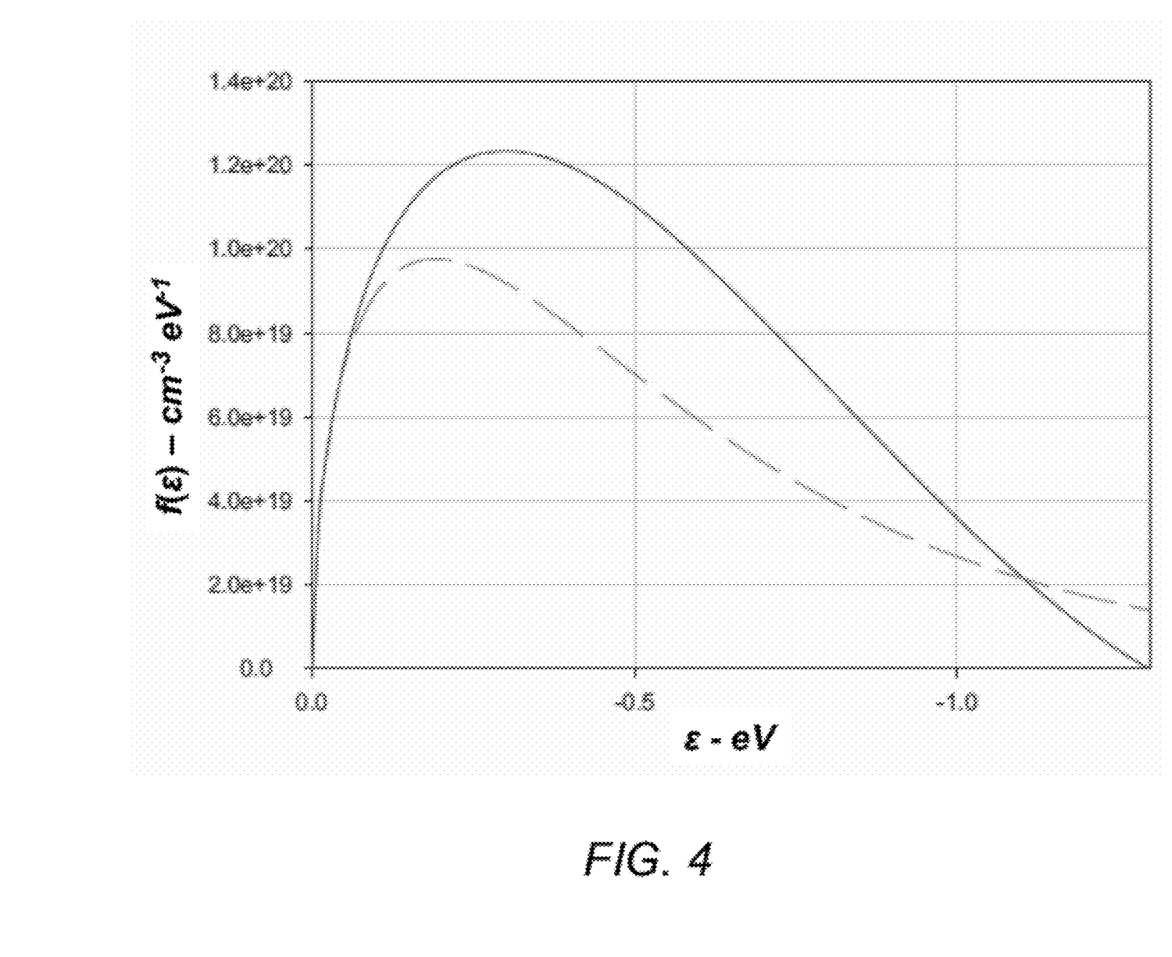
FIG. 4 depicts a plot of the electron distribution function $f(\varepsilon)$ found using aspects of the present invention.

FIG. 4 is a plot illustrating the electron energy distribution function found using a 2.54 cm probe at an analyzer sweep frequency of 3 MHz. In addition, by integrating $f(\epsilon)$, the computer also can find the electron energy density $n_{e0}$ and electron temperature $T_e$. In the case illustrated in FIG. 4, electron density $n_{e0}$ was found by the computer to be $1.23 \times 10^8$ cm$^{-3}$ and electron temperature $T_e$ was found to be 0.38 eV. These values comport with the values found by conventional Langmuir probe sweep, which gives $n_{e0} \cong 10^8$ cm$^{-3}$ and $T_e \cong 0.4$ eV.

Thus, the method presented here allows determination of the plasma potential by using a network analyzer to determine the ac impedance of a negatively biased, spherical probe, and as an added benefit the electron energy distribution may be calculated as described. The method is nonperturbative to the plasma since the signal applied is less than 10 mV. Other advantages include insensitivity to probe surface contamination and emission, the ability to isolate electron current from ion current, and the use of multiple frequencies to help verify the results. Also there is no reliance on curve fitting techniques and the method is less sensitive to noise than conventional determinations of plasma potential based on calculating a second derivative of collected current with respect to applied voltage.

It should be noted that one or more aspects of a method for determining plasma potential as described herein can be accomplished by one or more processors executing one or more sequences of one or more computer-readable instructions read into a memory of one or more computers from volatile or non-volatile computer-readable media capable of storing and/or transferring computer programs or computer-readable instructions for execution by one or more computers.

Although particular embodiments, aspects, and features have been described and illustrated, it should be noted that the invention described herein is not limited to only those embodiments, aspects, and features. It should be readily appreciated that modifications may be made by persons skilled in the art, and the present application contemplates any and all modifications within the spirit and scope of the underlying invention described and claimed herein.

Such embodiments are also contemplated to be within the scope and spirit of the present disclosure.

What is claimed is:

1. A computer-implemented method for determining a potential $\phi_p$ of a plasma, comprising:

inserting a probe into the plasma, the probe having a radius $r_0$ much larger than a Debye length $\lambda_D$ of the plasma, the probe further being connected to a network analyzer;

applying an rf signal having an ac voltage and a frequency $\omega$ to the probe and sweeping through a predetermined range of dc bias voltages $V_p$, the amplitude of each applied dc bias voltage with respect to chamber ground being much greater than the amplitude of the applied ac voltage of the rf signal and the frequency $\omega$ of the rf signal being much less than an unperturbed plasma frequency $\omega_{p_0}$ ($\omega < \omega_{p_0}$);

measuring, with the network analyzer, an ac impedance $Z_{ac}$ of the plasma throughout the dc voltage bias range for a series of fixed frequencies in the range noted above, the ac impedance $Z_{ac}$ including a real part $\text{Re}(Z_{ac})$ and an imaginary part $\text{Im}(Z_{ac})$;

inputting the values of dc bias voltages $V_p$ and the corresponding values of $\text{Re}(Z_{ac})$ into an appropriately programmed computer;

taking, at the computer, a first derivative of $\text{Re}(Z_{ac})$ with respect to dc bias voltage $V_p$; and determining, at the computer, the value of dc bias voltage $V_p$ for which $$\frac{d\text{Re}(Z_{ac})}{dV_p} = 0$$

within an error tolerance;

wherein the value of $V_p$ for which $$\frac{d\text{Re}(Z_{ac})}{dV_p} = 0$$

equals the plasma potential $\phi_p$.

2. The computer-implemented method according to claim 1, wherein $\omega < 0.1\omega_{p_0}$.

3. The computer-implemented method according to claim 1, wherein $r_0 \geq 10\lambda_D$.

4. A computer-implemented method for estimating a potential $\phi_p$ of a plasma, comprising:
inserting a probe into the plasma, the probe having a radius $r_0$ much larger than a Debye length $\lambda_D$ of the plasma and being connected to a network analyzer;
applying an rf signal having an ac voltage and a frequency $\omega$ to the probe and sweeping through a predetermined range of dc bias voltages $V_p$, the amplitude of each applied dc bias voltage with respect to chamber ground being much greater than the amplitude of the applied ac voltage of the rf signal and the frequency $\omega$ of the rf signal being much less than an unperturbed plasma frequency $\omega_{p_0}$ ($\omega < \omega_{p_0}$);
measuring, with the network analyzer, an ac impedance $Z_{ac}$ of the plasma throughout the dc voltage bias range for a series of fixed frequencies in the range noted above, the ac impedance $Z_{ac}$ at each dc bias voltage $V_p$ including a real part $\text{Re}(Z_{ac})$ and an imaginary part $\text{Im}(Z_{ac})$; and
plotting the values of $\text{Re}(Z_{ac})$ against the values of $V_p$ on a visual display;
wherein the plasma potential $\phi_p$ approximately equals the value of $V_p$ where the plot exhibits a local minimum.

5. The computer-implemented method according to claim 4, wherein $\omega < 0.1\omega_{p_0}$.

6. The computer-implemented method according to claim 4, wherein $r_0 \geq 10\lambda_D$.

7. The computer-implemented method according to claim 4, further comprising estimating the plasma potential $\phi_p$ from a visual inspection of the plot of the values of $\text{Re}(Z_{ac})$ against the values of $V_p$.

8. A computer-implemented method for determining a potential $\phi_p$ of a plasma, comprising:
receiving, at a computer programmed with appropriate software, data representative of a plurality of dc bias voltages $V_p$ applied to a radiofrequency probe placed within the plasma, the probe having radius $r_0$ much larger than a Debye length $\lambda_D$ of the plasma and operating at a specified ac voltage and rf frequency $\omega$, $\omega$ being much less than an unperturbed plasma frequency $\omega_{p_0}$ ($\omega < \omega_{p_0}$);
receiving, at the computer, data representative of a corresponding plurality of values of $\text{Re}(Z_{ac})$, a real part of a complex impedance $Z_{ac}$ exhibited by the plasma as a result of the ac voltage and frequency of the probe, each value of $\text{Re}(Z_{ac})$ corresponding to a value of $V_p$ applied to the probe;
determining, at the computer, a relation between $\text{Re}(Z_{ac})$ and $V_p$;
taking, at the computer, a first derivative of $\text{Re}(Z_{ac})$ with respect to dc bias voltage $V_p$; and
determining, at the computer, the value of dc bias voltage $V_p$ for which $$\frac{d\text{Re}(Z_{ac})}{dV_p} = 0$$

within an error tolerance;
wherein the value of $V_p$ for which $$\frac{d\text{Re}(Z_{ac})}{dV_p} = 0$$

equals the plasma potential $\phi_p$.

9. The computer-implemented method according to claim 8, wherein the data is for the case where $\omega \geq 0.1\omega_{p_0}$.

10. The computer-implemented method according to claim 8, wherein the data is for the case where $r_0 \geq 10\lambda_D$.

11. A computer-implemented method for estimating a potential $\phi_p$ of a plasma, comprising:
receiving, at a computer programmed with appropriate software, data representative of a plurality of dc bias voltages $V_p$ applied to a radiofrequency probe placed within the plasma, the probe having radius $r_0$ much larger than a Debye length $\lambda_D$ of the plasma and operating at a specified ac voltage and rf frequency $\omega$, $\omega$ being much less than an unperturbed plasma frequency $\omega_{p_0}$ ($\omega < \omega_{p_0}$);
receiving, at the computer, data representative of a corresponding plurality of values of $\text{Re}(Z_{ac})$, a real part of a complex impedance $Z_{ac}$ exhibited by the plasma as a result of the ac voltage and frequency of the probe, each value of $\text{Re}(Z_{ac})$ corresponding to a value of $V_p$ applied to the probe; and
plotting the values of $\text{Re}(Z_{ac})$ against the values of $V_p$ on a visual display;
wherein the plasma potential $\phi_p$ approximately equals the value of $V_p$ where the plot exhibits a local minimum.

12. The computer-implemented method according to claim 11, wherein the data is for the case where $\omega < 0.1\omega_{p_0}$.

13. The computer-implemented method according to claim 11, wherein the data is for the case where $r_0 \geq 10\lambda_D$.

14. A computer-implemented method for determining a potential $\phi_p$ of a plasma, comprising:
inserting a probe into the plasma, the probe having a radius $r_0$ much larger than a Debye length $\lambda_D$ of the plasma, the probe further being connected to a spectrum analyzer, a signal generator, and appropriate external circuitry which would make possible a unique determination of $\text{Re}(Z_{ac})$;
using the signal generator, applying an rf signal having an ac voltage and a frequency $\omega$ to the probe and sweeping through a predetermined range of dc bias voltages $V_p$, the amplitude of each applied dc bias voltage with respect to chamber ground being much greater than the amplitude of the applied ac voltage of the rf signal and the frequency $\omega$ of the rf signal being much less than an unperturbed plasma frequency $\omega_{p_0}$ ($\omega < \omega_{p_0}$);
determining with the spectrum analyzer, signal generator and additional circuitry, an ac impedance $Z_{ac}$ of the plasma throughout the dc voltage bias range for a series of fixed frequencies in the range noted above where the real and imaginary parts, $\text{Re}(Z_{ac})$ and $\text{Im}(Z_{ac})$, are separately determined using an algorithm based on the experimental arrangement and external circuitry
inputting the values of dc bias voltages $V_p$ and the corresponding values of $\text{Re}(Z_{ac})$ into an appropriately programmed computer;

taking, at the computer, a first derivative of Re($Z_{ac}$) with respect to dc bias voltage $V_p$; and determining, at the computer, the value of dc bias voltage $V_p$ for which $$\frac{d\text{Re}(Z_{ac})}{dV_p} = 0$$

within an error tolerance; and wherein the value of $V_p$ for which $$\frac{d\text{Re}(Z_{ac})}{dV_p} = 0$$

equals the plasma potential $\phi_p$.

* * * * *